(12) United States Patent
Stephenson et al.

(10) Patent No.: US 9,588,166 B2
(45) Date of Patent: Mar. 7, 2017

(54) GROUND QUALITY CHECK SYSTEMS AND METHODS

(71) Applicant: Wood Stone Corporation, Bellingham, WA (US)

(72) Inventors: Mark L. Stephenson, Bellingham, WA (US); Aaron Michelle, Bellingham, WA (US)

(73) Assignee: WOOD STONE CORPORATION, Bellingham, WA (US)

( * ) Notice: Subject to any disclaimer, the term of this patent is extended or adjusted under 35 U.S.C. 154(b) by 71 days.

(21) Appl. No.: 14/685,550

(22) Filed: Apr. 13, 2015

(65) Prior Publication Data

US 2015/0293164 A1 Oct. 15, 2015

Related U.S. Application Data

(60) Provisional application No. 61/978,629, filed on Apr. 11, 2014.

(51) Int. Cl.
*G01R 31/02* (2006.01)
*G01R 31/42* (2006.01)
*G01R 29/027* (2006.01)

(52) U.S. Cl.
CPC ........... *G01R 31/025* (2013.01); *G01R 31/42* (2013.01); *G01R 29/027* (2013.01)

(58) Field of Classification Search
CPC combination set(s) only.
See application file for complete search history.

(56) References Cited

U.S. PATENT DOCUMENTS

| | | | |
|---|---|---|---|
| 3,996,496 A | 12/1976 | Volk | |
| 4,649,454 A | 3/1987 | Winterton | |
| 4,709,164 A | 11/1987 | Giesl | |
| 5,278,512 A | 1/1994 | Goldstein | |
| 5,606,480 A | 2/1997 | Nevo | |
| 8,134,371 B2 | 3/2012 | Han | |
| 2013/0278271 A1 | 10/2013 | Hein et al. | |

FOREIGN PATENT DOCUMENTS

| | | |
|---|---|---|
| EP | 0778467 A2 | 6/1997 |
| GB | 2167618 A | 5/1986 |
| GB | 2342455 A | 4/2000 |
| JP | 2012085490 A | 4/2012 |
| RU | 20413 | 10/2001 |
| WO | 9117596 A1 | 11/1991 |

*Primary Examiner* — Clayton E Laballe
*Assistant Examiner* — Jas Sanghera
(74) *Attorney, Agent, or Firm* — Michael R. Schacht; Schacht Law Office, Inc.

(57) ABSTRACT

A ground check system for checking a ground conductor of a power supply comprising at least one line conductor comprises a pulse generator and a compare circuit. The pulse generator applies a test signal to a test circuit formed at least in part by the ground conductor and the at least one line conductor when an AC voltage on the at least one line conductor is approximately zero volts. The compare circuit compares the test signal passing through the test circuit with at least one test criteria indicative of an unacceptable ground.

20 Claims, 15 Drawing Sheets

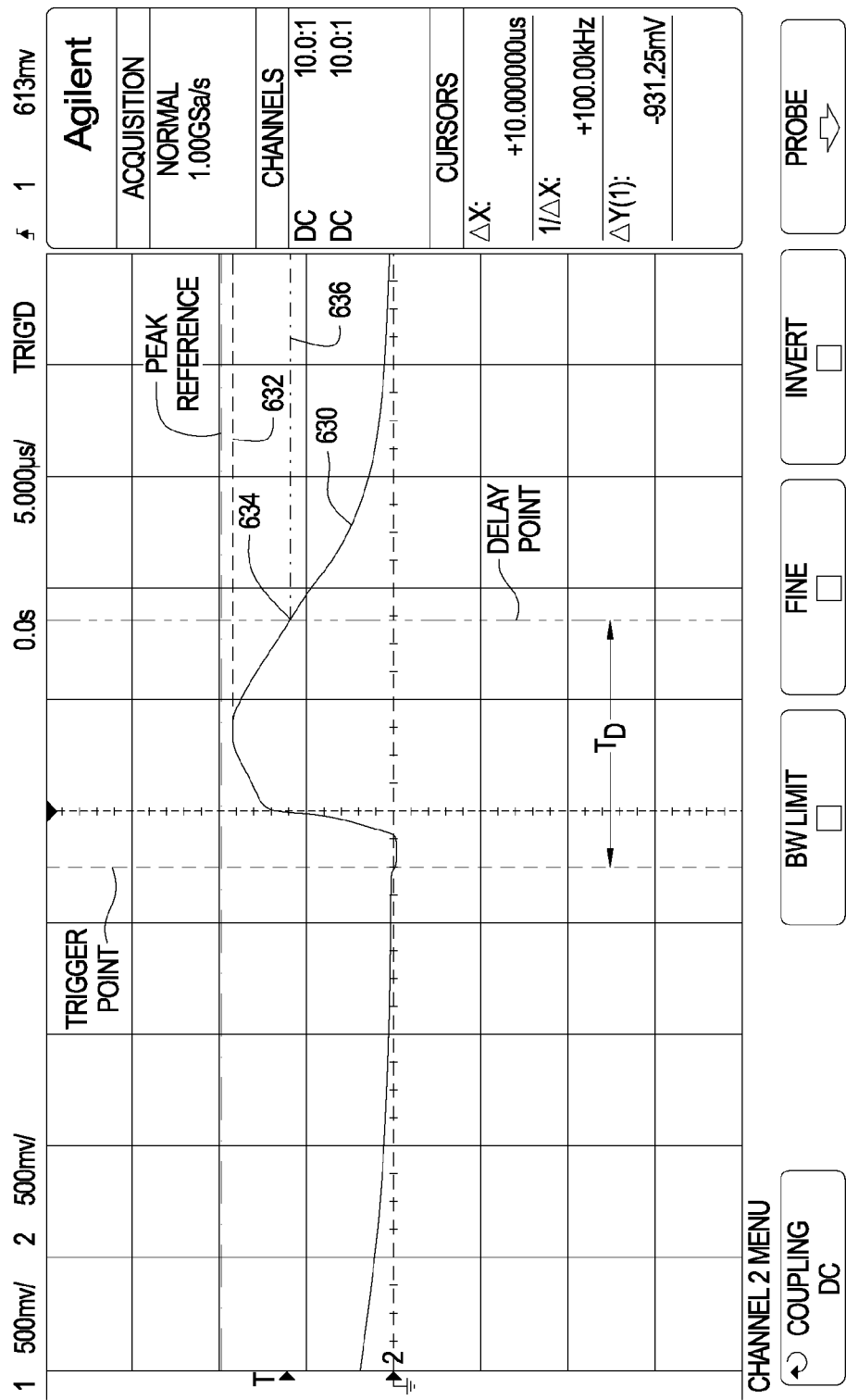

GROUND QUALITY CHECK SYSTEMS AND METHODS

RELATED APPLICATIONS

This application, U.S. patent application Ser. No. 14/685,550 filed Apr. 13, 2015 claims benefit of U.S. Provisional Application Ser. No. 61/978,629 filed Apr. 11, 2014, the contents of which are incorporated herein by reference.

TECHNICAL FIELD

The present invention relates to systems and methods for checking the presence and quality of a ground connection to an appliance and, in particular, ground quality check systems and methods for use with electrical appliances that are installed in locations with unknown or untested sources of electrical power.

BACKGROUND

Electrical appliances are often installed in locations where the source of electrical power is unknown and/or untested. For example, in an older building, an outlet may be installed in the wall, but the outlet may not have been properly connected to ground. Further, in older buildings or buildings where electrical codes are not reliably enforced, wiring that at one time forms an acceptable ground may be altered such that the ground connection is no longer acceptable. As another example, a ground connection that appears to be acceptable upon initial installation of the appliance may in fact only appear to be acceptable due to the establishment of temporary ground.

The need thus exists for ground quality check systems and methods that verify the presence of a ground connection and the quality of that ground connection in order to exclude the possibility of a person or pool of water completing the circuit. The need further exists for ground quality check systems and methods that verify that an acceptable ground connection is maintained over time. The need further exists for ground fault qualifier systems and methods with very low power consumption needs.

SUMMARY

The present invention may be embodied as a ground check system for checking a ground conductor of a power supply comprising at least one line conductor comprising a pulse generator and a processor. The pulse generator applies a test signal to a test circuit formed at least in part by the ground conductor and the at least one line conductor when an AC voltage on the at least one line conductor is approximately zero volts. The processor compares the test signal passing through the test circuit with at least one test criteria indicative of an unacceptable ground.

The present invention may also be embodied as a method of checking a ground conductor of a power supply comprising at least one line conductor. One example method of the present invention comprises the following steps. A test circuit including at least the ground conductor and the at least one line conductor is formed. A test signal is applied to the test circuit when an AC voltage on the at least one line conductor is approximately zero volts. The test signal passing through the test circuit is compared with at least one test criteria indicative of an unacceptable ground.

The present invention may also be embodied as a ground check system comprising a zero cross detector, a pulse generator, a pulse peak detect system, a pulse shape detect system, and a processor. The zero cross detector generates a zero cross signal indicative of when an AC voltage on the at least one line conductor is at zero volts. The pulse generator applies a test signal to a test circuit formed at least in part by the ground conductor and the at least one line conductor based on the zero cross signal. The pulse peak detect system generates a pulse peak data value indicative of the peak voltage of the test signal. A pulse shape detect system generates a pulse data value indicative of the voltage of the test signal after a predetermined period of time. The processor generates a ground pass signal when the pulse peak data value meets predetermined peak criteria and the pulse shape data value meets predetermined shape criterial.

BRIEF DESCRIPTION OF THE DRAWINGS

FIGS. 7A and 7B are scope traces depicting an acceptable pulse and an unacceptable pulse as measured by a ground quality check system of the present invention.

DETAILED DESCRIPTION

Figure 1:
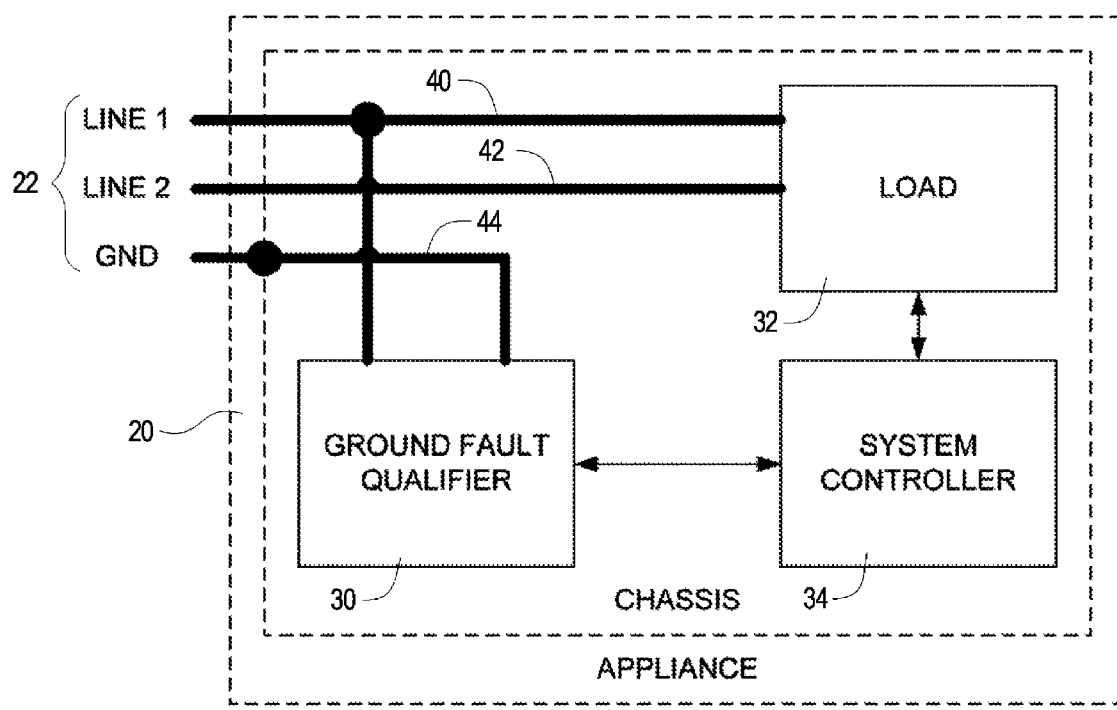
FIG. 1 is a functional block diagram of an appliance containing a ground quality check system of the present invention.

Referring initially to FIG. 1 of the drawing, depicted therein is an appliance 20 that obtains power from a power source 22. The example appliance 20 comprises a ground quality check system 30, a load 32, and a system controller 34. The example power source 22 comprises a first line conductor 40, a second line conductor 42, and a ground conductor 44. The example general implementation of the ground quality check system 30 depicted in FIG. 1 is by way of example only, and one of ordinary skill in the art will recognize that the principles of the present invention may also be applied power supply comprising a single line with neutral and/or to a power supply comprising a 3-phase circuit.

As is conventional, the load 32 and system controller 34 assume that the power source 22 provides a proper ground for safe operation of the appliance 20. However, a plug, cord, or building wiring forming part of the power source 22 may be missing a ground connection. Further, a plug, cord, or building wiring of the power source 22 that at one time provides or appears to provide an adequate ground connection may be altered or deteriorate over time such that the ground connection is inadequate.

As shown in FIG. 1, the ground quality check system 30 is connected between one or the other of the first and second line conductors 40 or 42 and the ground conductor 44. The example ground quality check system 30 is connected between the first line conductor 40 and the ground conductor 44. In general, the ground quality check system 30 injects into a circuit including the first line conductor 40 and the ground conductor 44. Based on one or more predetermined conditions, the ground quality check system 30 measures at least one characteristic of a measured pulse indicative of whether the ground conductor 44 establishes a suitable ground. If the ground quality check system 30 determines that the ground established by the ground conductor 44 is not suitable, the ground quality check system 30 notifies (e.g., by sending a signal or by failing to send a signal) the system controller 34 of the presence of an acceptable ground condition. When the ground established by the ground conductor 44 is not suitable, the system controller 34 may limit or cease operation of the load 32 until the ground conductor 44 provides a proper ground.

Figure 2:
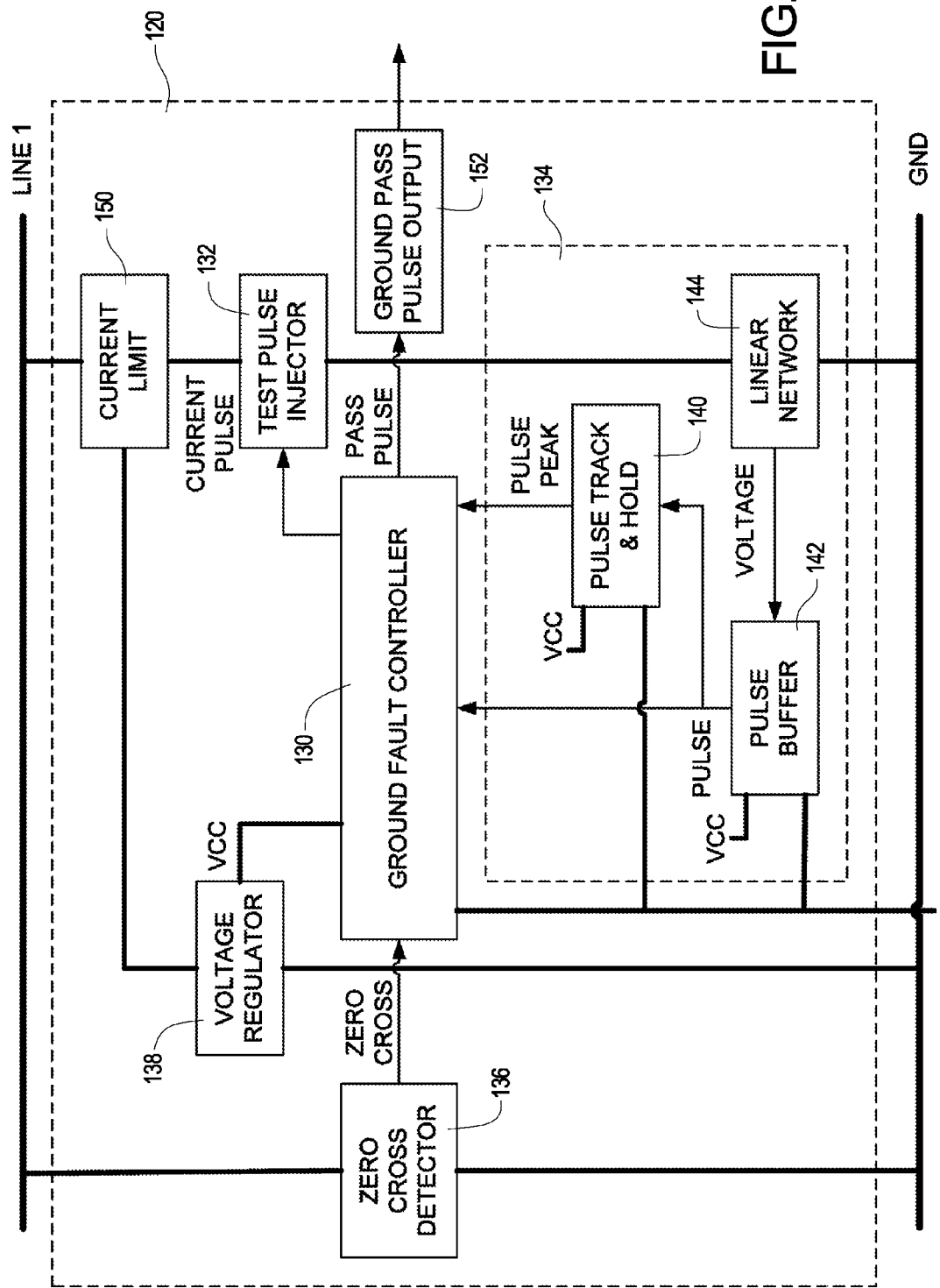
FIG. 2 is a functional block diagram of an example ground quality check system that may be used with the appliance of FIG. 1.

FIG. 2 contains a functional block diagram containing the details of an example ground fault check system 120 that may be used as the ground quality check system 30 described above. The example ground fault check system 120 comprises a ground fault controller 130 (e.g., comprises an internal analog digitizer for signal qualification), a test pulse injector 132, an analog signal conditioner 134, a zero crossing detector 136, and a power supply 138.

The example ground fault controller 130 is a general purpose microcontroller comprising an integral processor, volatile and non-volatile memory, timer-counters, and analog to digital (A to D) conversion circuitry. The example ground fault controller 130 runs a firmware program that implements certain logic steps. As an example, the logic steps may include measuring a test pulse signal (e.g., by digitizing the decaying pulse) and a reference voltage, each relative to the pulse peak. These logic steps can be implemented in hardware, but the use of a reprogrammable microcontroller provides low cost, power savings, and flexibility.

The test pulse injector 132 allows the ground fault controller 130 to introduce a test pulse into the test circuit including the ground conductor but isolates the ground fault controller 130 from the power source 22.

The example analog signal conditioner 134 comprises a pulse peak track-and-hold 140 and a pulse waveform buffer 142. The example pulse peak track-and-hold 140 captures the peak pulse value and provides a buffered voltage equivalent to the reference input of the A to D converter. The example pulse shape buffer 142 provides a buffered voltage to an A-to-D converter input following the shape of the voltage pulse waveform. The example linear network 144 causes a scaled voltage proportional to the current pulse of interest to appear the input of the pulse buffer 142. The current limit 150 limits action of the complex impedance of capacitor C7 (FIG. 4B) on the total current into the ground terminal. The ground pass output 152 avows communication to an external circuit as will be described in further detail below.

The example zero cross detector 136 is configured to generate a transition on the digital output signal whenever the AC power voltage on the first (connected) line conductor 40 crosses the zero point (goes from positive to negative or from negative to positive). In the example ground fault qualifier 120, the resulting ZERO CROSS signal is a 60 Hz square wave (for 60 Hz power) that wakes the controller from sleep once per cycle on the predetermined edge (e.g., rising edge).

Figure 3A:
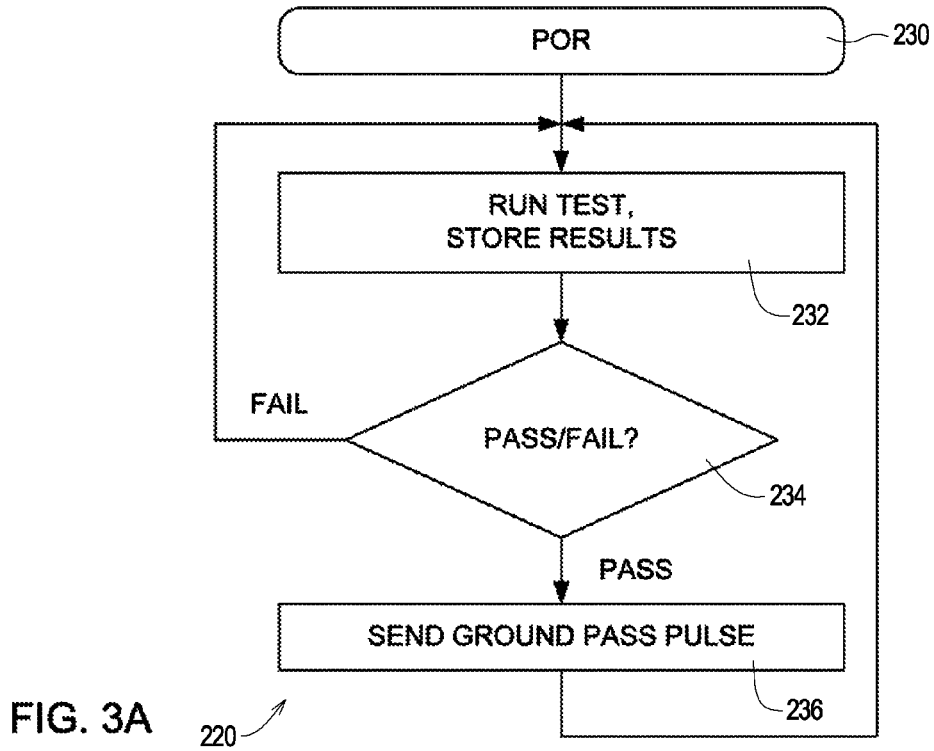
FIGS. 3A-C are flow charts depicting the logic flow that may be implemented by the ground quality check system of FIG. 2.

The firmware running on the ground fault controller 130 runs a main routine 220 as depicted in FIG. 3A. The main routine 220 begins at a step 230 and runs a test on the ground connection and stores the results of that test at step 232. At step 234, the main routine 220 determines whether the stored test results meet predetermined test criteria. If the stored test results do not meet the predetermined test criteria at step 234, the main routine 220 returns to step 232 and performs the test again. If the stored test results do meet the predetermined test criteria at step 234, the main routine 220 proceeds to step 236 at which the ground pass pulse is generated.

Figure 3B:
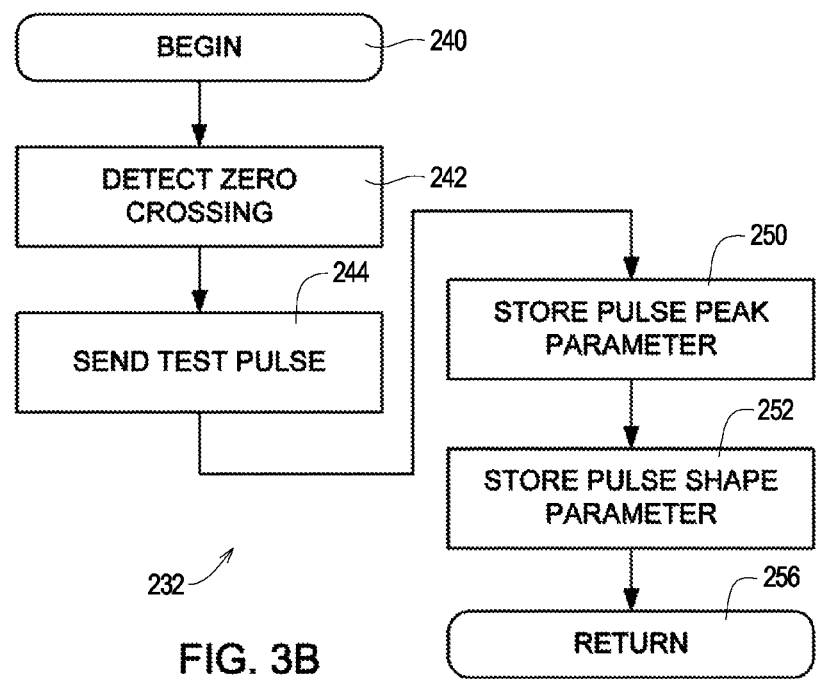

Referring now to FIG. 3B, the details of the run test and store results routine (test routine) performed at step 232 will be described in further detail. The step 232 begins at 240. When the zero cross detector 136 determines that the AC power signal crosses zero at a step 242, the test routine 232 causes the ground fault controller 130 to generate a test pulse at step 244 that is introduced into a circuit including the ground conductor 44. At a step 252, the test routine 232 measures and stores the pulse shape parameter presented by the pulse shape buffer 142. At a step 250, the test routine 232 measures and stores the pulse peak parameter presented by the pulse peak track and hold 140. The test routine 232 then returns to the main routine 220 at a step 256.

Figure 3C:
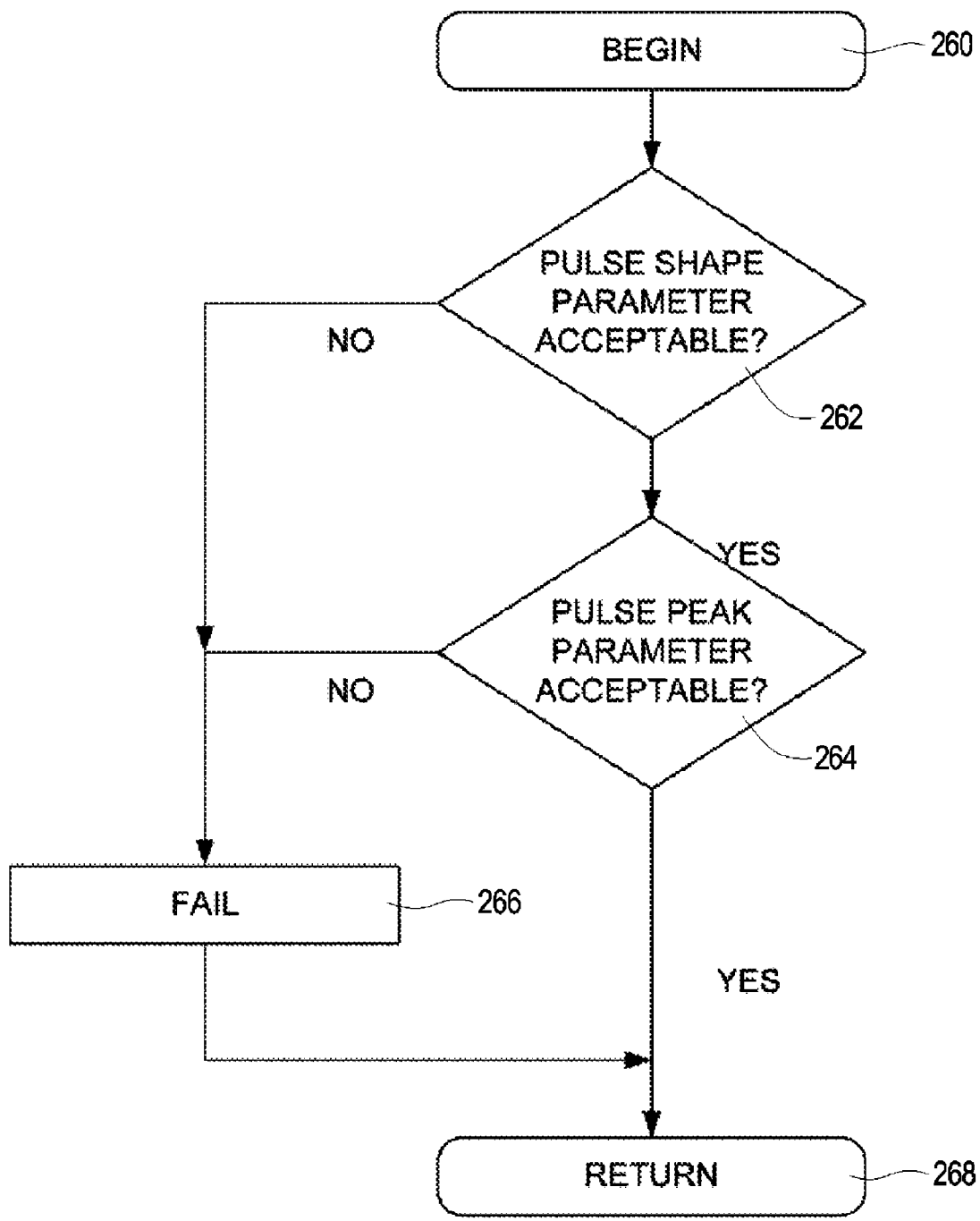

FIG. 3C illustrates an example pass/fail routine that may be performed at step 234 to determine whether or not the stored test results meet the predetermined test criteria. At a step 260, the pass/fail routine 234 begins. At step 262, the pass/fail routine 234 determines whether the stored pulse shape parameter meets predetermined pulse shape criteria.

If the pass/fail routine 234 determines at step 262 that the stored pulse shape parameter meets predetermined pulse shape criteria, the pass/fail routine 234 proceeds to step 264 to determine whether the stored pulse peak parameter meets predetermined pulse peak criteria. If the pass/fail routine 234 determines at step 262 that the stored pulse shape parameter does not meet the predetermined pulse shape criteria, the pass/fail routine 234 proceeds to step 266 at which a Fail flag is set indicating a possible faulty ground circuit.

If the pass/fail routine 234 determines at step 266 that the stored pulse peak parameter meets predetermined pulse shape criteria, the pass/fail routine 234 proceeds to step 268 and returns to the main routine 220. If the pass/fail routine 234 determines that the stored pulse peak parameter does not meet the predetermined pulse shape criteria, the pass/fail routine 234 proceeds to step 266 at which the Fail flag is set indicating a possible faulty ground circuit.

In any situation in which one or more Fail flags are set at step 266, the result of step 234 of the main routine 220 will be FAIL, and the main routine 220 returns to the test routine 232 as shown in FIG. 3A. However, if no Fail flag is set at step 266, the result of step 234 of the main routine 220 will be PASS, and the main routine 220 proceeds to step 236 at which the ground pass pulse is generated.

The example ground fault qualifier 120 and main routine 220 implemented by the ground fault controller 130 thus generates the ground pass pulse as long as the measured pulse falls within the predetermined pulse parameters. In any situation in which the test pulse as measured falls outside the predetermined pulse parameters or the ground fault qualifier 120 fails, the ground fault controller 130 will stop generating the ground pass pulse. The system controller 34 can thus operate normally as long as the ground pass pulse is present and can take appropriate action to protect users of the appliance 20 if the ground pass pulse is not present.

Figure 4A:
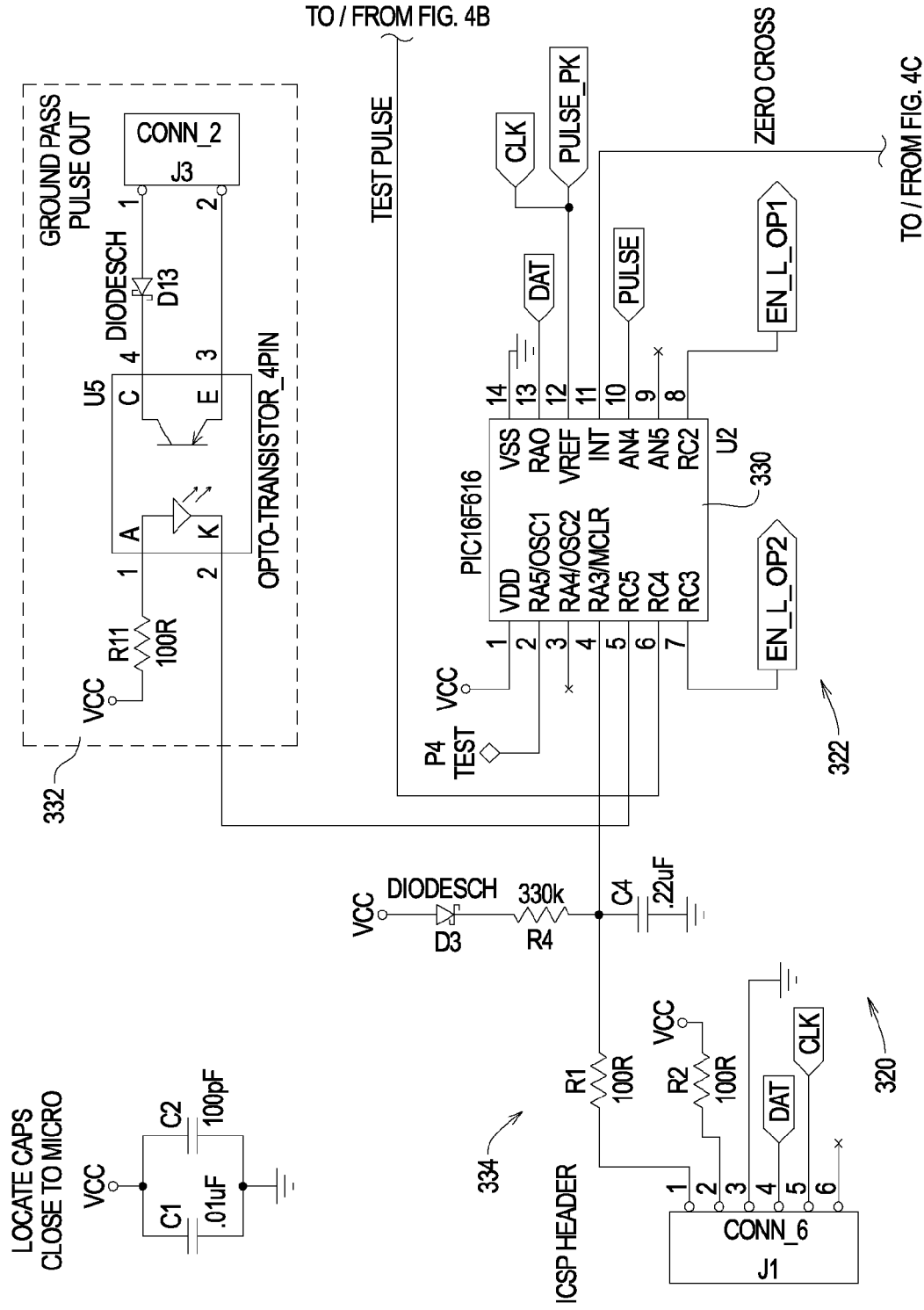
FIG. 4A-4D contain a circuit diagram of an example ground quality check system that may be used with the appliance of FIG. 1.

Turning now to FIGS. 4A-4D of the drawing, depicted therein is an example ground fault qualifier circuit 320 that may be used as the example ground fault qualifiers 30 and 120 described above. The example circuit 320 works basically as follows. The example ground fault qualifier circuit 320 periodically collects status information associated with the impedance of the safety ground connection to a main supervisory or control portion 322 (FIG. 4A). When the ground fault qualifier circuit 320 meets certain predetermined test trigger criteria, an opto-isolated transistor circuit 332 conducts up to 10 milliamps for a pulse duration of approximately 75 micro seconds from/to an externally supplied source such as the system controller 34. The opto-isolated transistor circuit 332 is an example of the ground pass output circuit 152 described above. The system controller 34 may read this output by supplying a current limited voltage to the output terminals of the ground quality check circuit 320 and monitoring for a low going voltage transition or a current pulse. In a normal high quality ground condition, the pulse is repeated once per second. If predetermined test criteria are not met or satisfied, there is no output pulse. In a variable and marginal conditions, the pulse may occur on any ½ second interval, but typically not more than once per second. Accordingly, if the pulse does not appear for more than two seconds, the ground circuit has failed three successive tests.

The ground quality check circuit 320 works between two input ports: the safety ground at the chassis (e.g., ground conductor 44), and one input line voltage (e.g., first line voltage 40). If either of these is absent, there is no output pulse because the circuit is not energized. When energized, the circuit draws less than 250 microamps from a 60 Hz 120V AC source (ref. to ground; this is ground leakage current).

The example ground fault qualifier circuit 320 operates by rectifying the line AC current into parallel paths and storing charge on capacitors C6 and C9 (FIG. 4B) at up to 18 volts DC. Once per second (if passing), capacitor C6 is discharged near the zero crossing time of the line voltage by triggering the triac in U3. This discharge can source several milliamps of current for a few microseconds and an EMF of under 20 volts (typically 17 volts). The use of a test signal comprising a pulse of relatively high current at relatively low voltage allows the ground fault qualifier circuit 320 safely to discriminate between copper and people.

In practice, the test signal is a pulse in a first voltage range of approximately 15-17 volts but in any event should be in a second voltage range of between 14 and 19 volts. The example test pulse is in a first current range of approximately 10 to 20 milliamp peak and should in any event be within a second range of approximately 0.1 to 30 milliamps peak under unusual and failing conditions. Further, the example test pulse should be injected within a first range of 10 microseconds after the zero crossing point and in any event should be within a second range of 17 microseconds after the zero crossing point. Stated alternatively, the example test pulse should be injected when the line voltage is within a first range of 0.3-0.5 volts and in any event within a second range of 0.05-1 volts.

With a test pulse generated within the parameters defined above, the circuit physics ensures that the higher current cannot be imposed on top of the line voltage. Each time the ground test succeeds, the output pulse is generated ½ second after the test pulse. If the test fails, the ground path is retested at that ½ second interval.

With the foregoing general understanding of the operation of the example ground quality check circuit 320 in mind, the construction and operation of the example ground quality check circuit 320 will now be described in further detail.

Initially, it should be noted that the main supervisory or control portion 322 depicted in FIG. 4A comprises a microcontroller 330 running a firmware program represented by the flow chart depicted in FIGS. 5A-5D. Microcontrollers such as the example microcontroller 330 are well known, and the example microcontroller 330 will not be described herein beyond that extent necessary for a complete understanding of the example ground quality check circuit 320. The example microcontroller 330 has an ultra low power sleep mode and an internal RC oscillator to enable instant wake from sleep. FIG. 4A also shows that an optical transistor portion 332 allows a ground pass out signal generated by the microcontroller 330 to be transmitted to an external device such as the example system controller 34 described above. FIG. 4A further illustrates that a connector portion 334 allows data to be transferred between the microcontroller 330 and an external device to allow reprogramming and debugging of and download of data from the microcontroller 330.

Figure 4B:
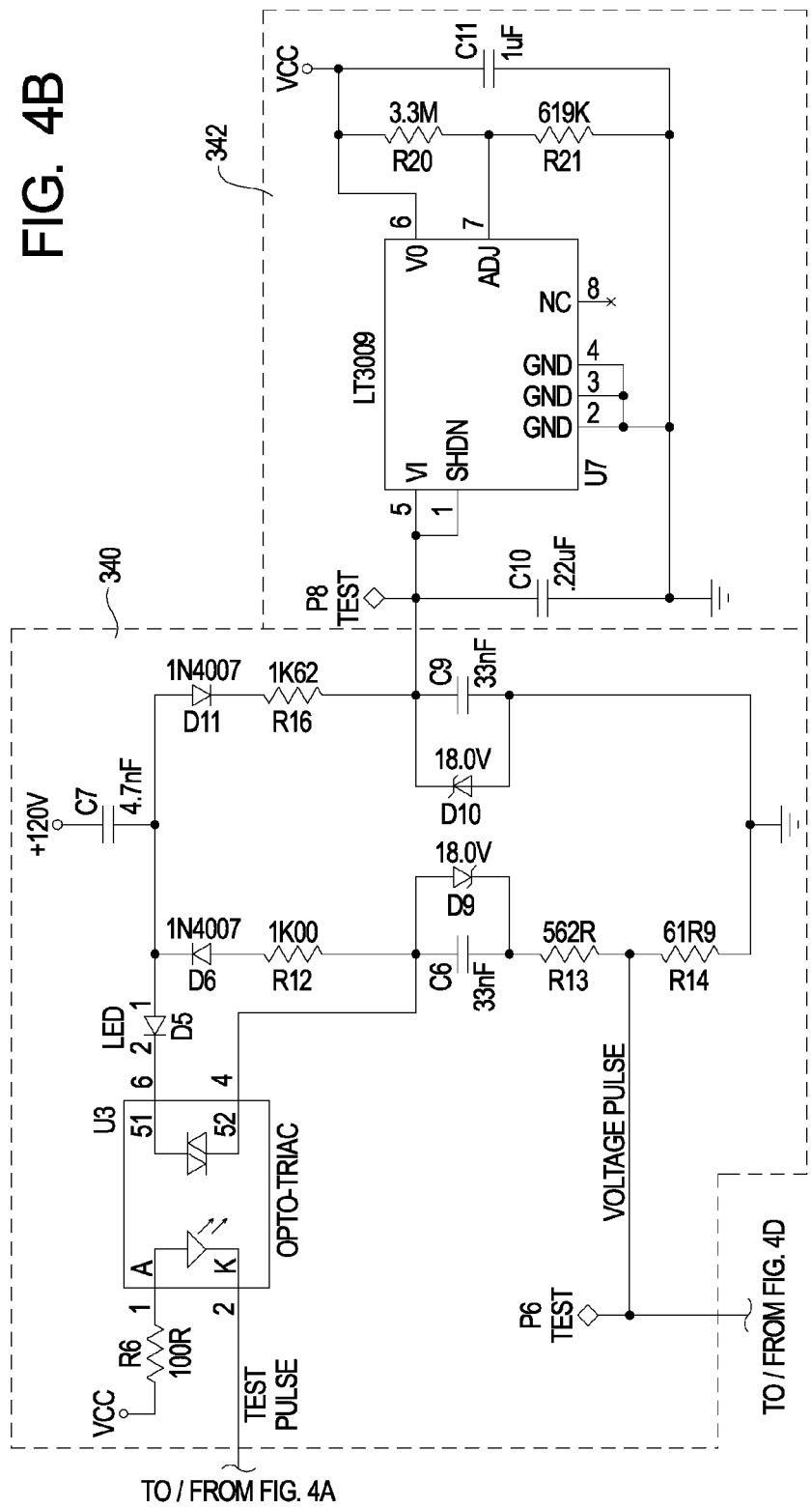

FIG. 4B illustrates that the example ground quality check circuit 320 further comprises a line voltage interface portion 340 and a voltage regulator portion 342. The line voltage interface portion 340 is connected to an input line voltage conductor such as the first line voltage conductor 40 described above. The line voltage interface circuit further rectifies a signal present on the first line voltage conductor 40 and limits the rectified voltage to around 17 volts. In particular, the line voltage interface portion 340 generates a VOLTAGE pulse signal based on the TEST pulse signal initiated by the microcontroller 330 and switched by the optical triac U3.

The rectified, limited voltage is also supplied to the voltage regulator portion 342. The voltage regulator portion 342 generates a voltage VCC appropriate for providing power to the various active components of the example ground fault qualifier circuit 320.

Figure 4C:
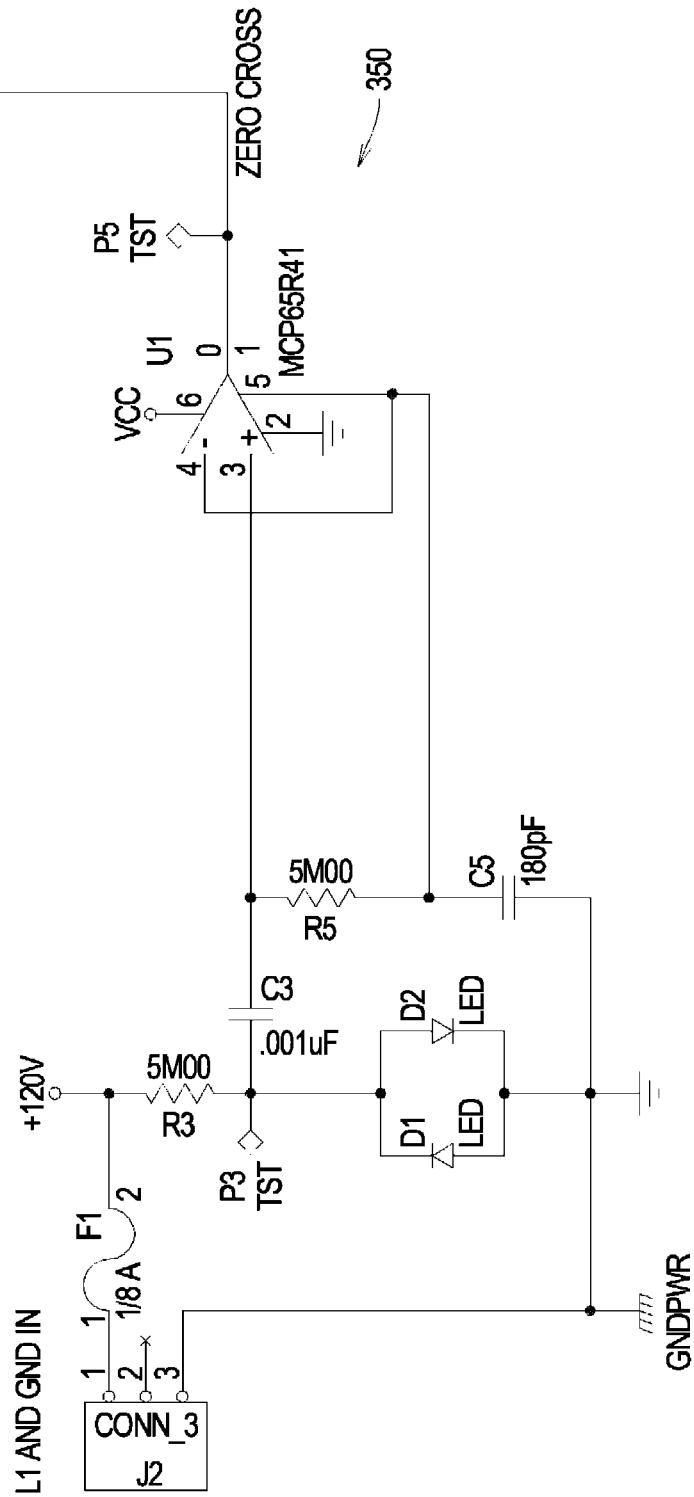

FIG. 4C illustrates a zero cross over detection portion 350 of the example ground quality check circuit 320. The zero cross over detection portion 350 generates a ZERO CROSS signal at each point in time at which the line voltage transitions from positive to negative. The resulting ZERO CROSS signal is a square wave that is applied to the microcontroller 330. The microcontroller 330 is triggered at each rising zero crossing point and takes action upon receipt of the rising edge of each of the pulses of the zero crossing pulse train.

Figure 4D:
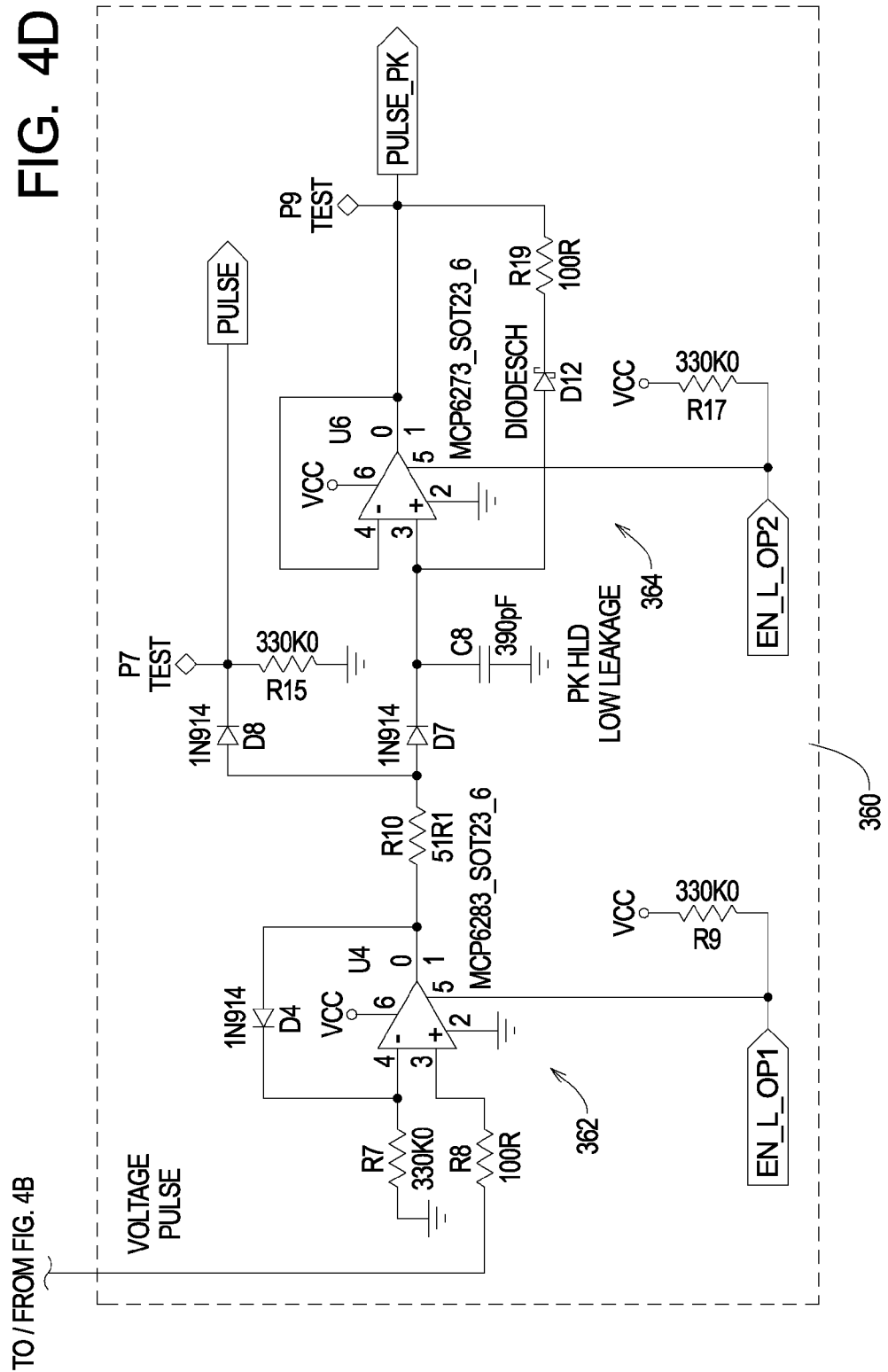

FIG. 4D illustrates that the VOLTAGE pulse signal generated by the line voltage interface portion 340 is transmitted to a buffering circuit 360 comprising a first op amp circuit 362 and a second op amp circuit 364. The first op amp circuit 362 generates a PULSE signal indicative of a shape of the VOLTAGE pulse signal. In particular, the PULSE signal tracks the value of the VOLTAGE pulse signal in time. Based on the VOLTAGE pulse signal, the second op amp circuit 364 generates a PULSE_PK signal corresponding to a peak of the VOLTAGE pulse signal. The PULSE and PULSE_PK signals are both input to the microcontroller 330.

The microcontroller 330 thus has as inputs the ZERO CROSS signal, the PULSE signal, and the PULSE_PK signal. The microcontroller 330 has as primary outputs the TEST pulse signal and the GROUND PASS signal.

In addition, the microcontroller 330 generates EN_L_OP1 and EN_L_OP2 signals for allowing the op amp circuits 362 and 364 to be energized and de-energized. The microcontroller 330 further is capable of putting itself to sleep (de-energized) and waking up (energized) based on external inputs. In this case, the microcontroller 330 wakes upon receiving the leading edge of the ZERO CROSS signal and goes to sleep after performing the logic implemented by the firmware running on the microcontroller 330 as described below with reference to FIGS. 5A-5D. The microcontroller 330 may thus turn off itself and other relatively high power consuming circuits, such as the op amp circuits 362 and 364, when appropriate to conserve energy.

Figure 5A:
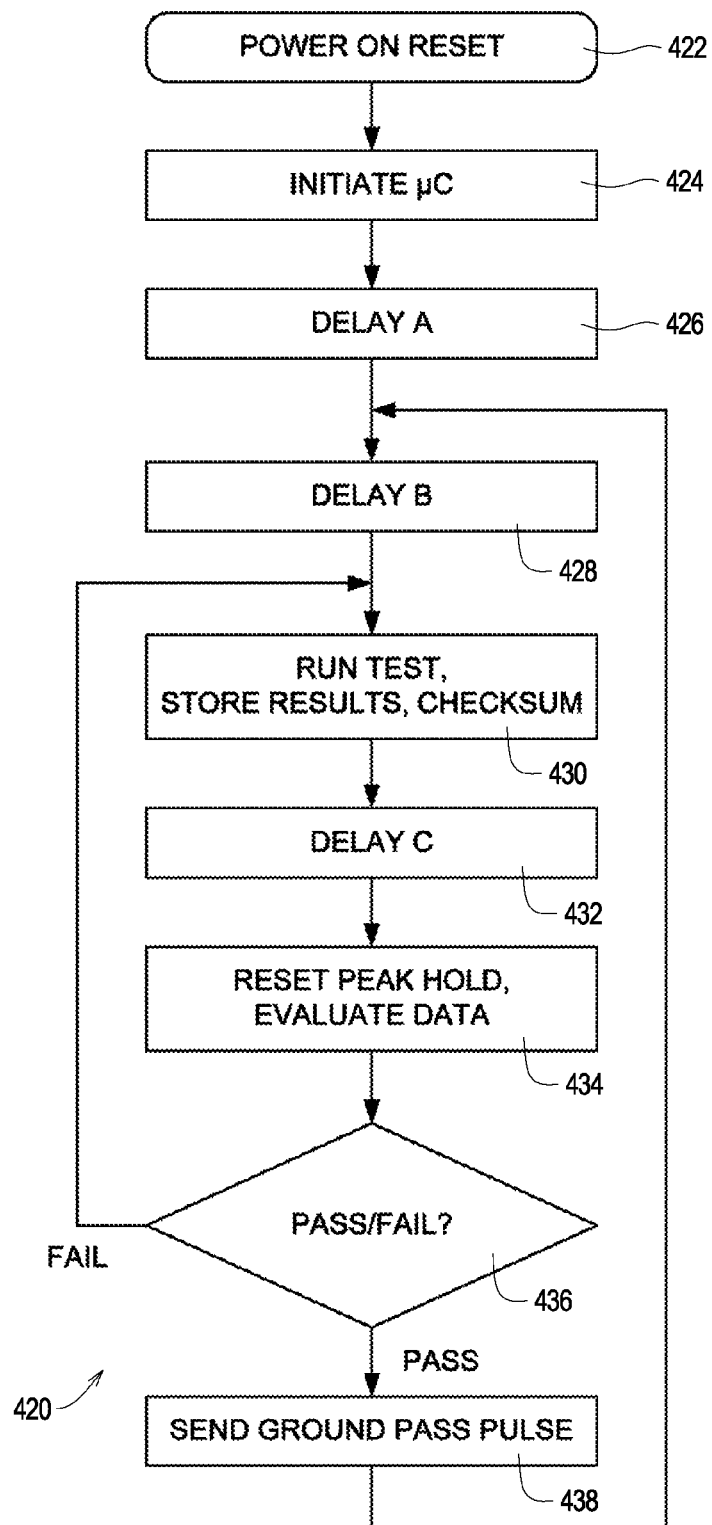
FIGS. 5A-D are flow charts depicting the logic flow that may be implemented by a microprocessor of the ground quality check system of FIGS. 4A-4D.

Referring now to FIGS. 5A-5D, an example of firmware capable of running on the example microcontroller 330 will now be described. FIG. 5A illustrates a main routine 420. The components of the ground quality check circuit 320 are powered on and reset at step 422 and the microcontroller 330 is initialized at step 424. The main routine 420 then performs a first delay step 426 for a first time period A as will be discussed in further detail below.

After the first delay step 426, the main routine 420 performs a second delay step 428 for a second period of time B. After the second time period B, the main routine 420 performs a run test step 430 at which the PULSE and PULSE_PEAK signals are sampled to generate a PULSE data value and a PULSE_PEAK data value.

After a third delay step 432 for a third period of time C, the peak hold circuit 364 is reset and the data values are evaluated, the main routine performs a pass/fail step 436 at which it is determined whether the measured PULSE and PULSE_PEAK data values both meet associated predetermined criteria. If either the PULSE data value or the PULSE_PEAK data value does not meet the associated predetermined criteria, the main routine 420 loops back and performs steps 430, 432, 434, and 436. The main routine 420 stays in this loop as long as either of the measured PULSE and PULSE_PEAK data values do not meet the predetermined criteria associated therewith.

If both the PULSE data value and the PULSE_PEAK data value meets the predetermined criteria associated therewith, the main routine 420 proceeds to step 438 at which the GROUND PASS pulse is generated.

Figure 5B:
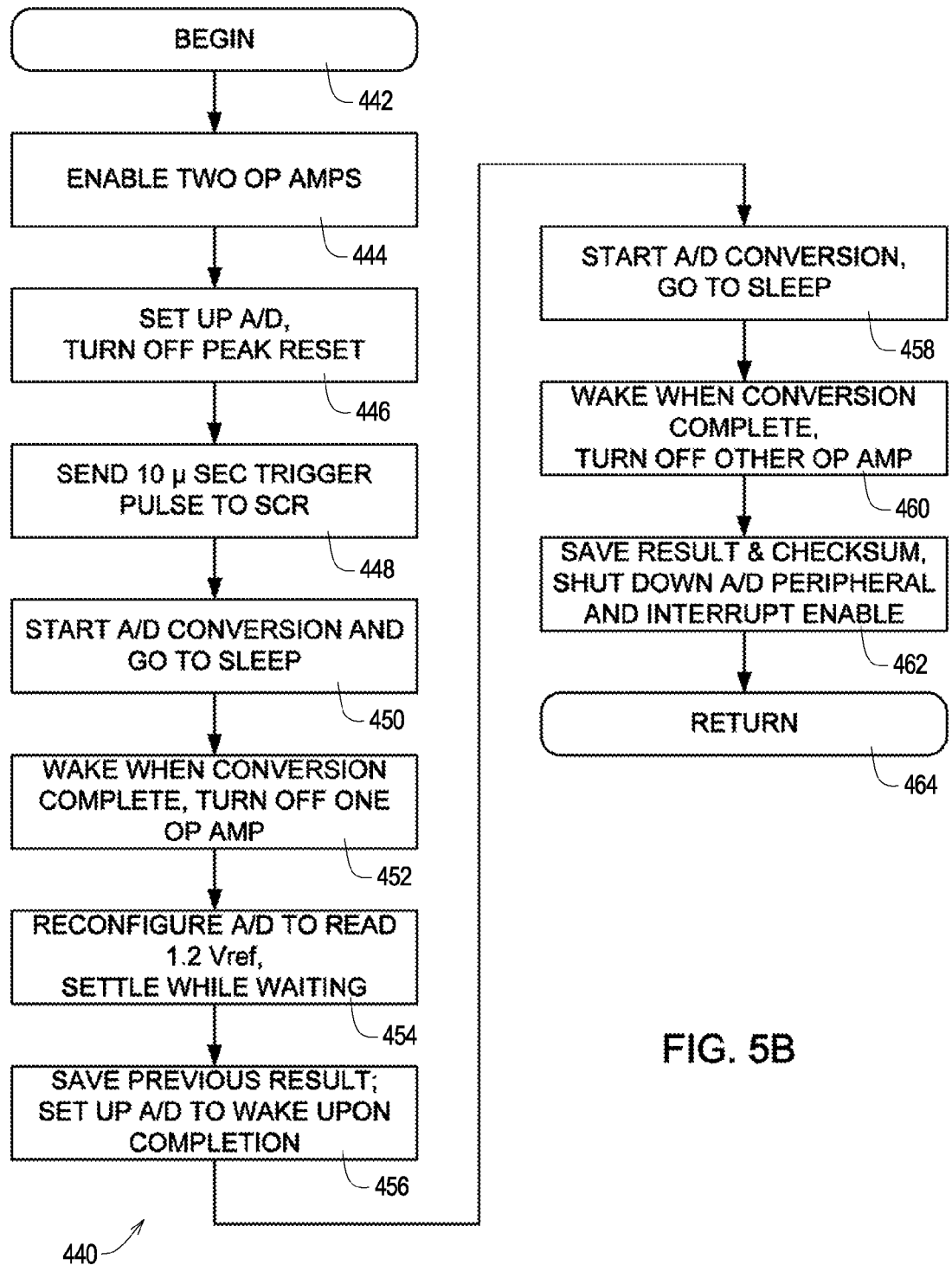

FIG. 5B illustrates an example run test routine 440 that may be performed at step 430 of the main routine 420. Certain details of the example run test routine 440 are specific to the example ground fault qualifier circuit 320 described above and may be altered or omitted should different hardware be used to generate the PULSE and PULSE_PEAK signals.

The run test routine 440 begins at step 442 and then proceeds to step 444 at which the first and second op amp circuits 362 and 364 of the buffering circuit 360 are enabled. The run test routine 440 then sets up the A/D converter internal to the microcontroller 330 and turns off the peak reset control signal.

The run test routine 440 then causes the microcontroller 330 to trigger the test pulse at step 448 and then, after a predetermined delay interval, starts a first A/D conversion process measuring PULSE relative to PULSE_PK and goes to sleep at step 450. When the first A/D conversion process is complete, the run test routine 440 wakes and turns off one of the op amps (e.g., the first op amp circuit 362). The A/D converter internal to the microprocessor 330 is reconfigured to measure the 1.2 volt internal reference voltage, also relative to PULSE_PK, and then allowed to settle while the previous results are then stored at step 456.

At step 456, the A/D portion is set to wake up upon completion of the second A/D conversion process. At step 458 the second A/D conversion process is started with the reconfigured settings and the remaining microprocessor circuitry is caused to go to sleep. When the second A/D conversion process is complete, the microprocessor 330 wakes at step 460 and turns off the other op amp (e.g., the second op amp circuit 364). The result of the second A/D conversion process and a checksum is stored at step 462. The run test routine 440 then returns to the main routine 420 at step 464.

Figure 5C:
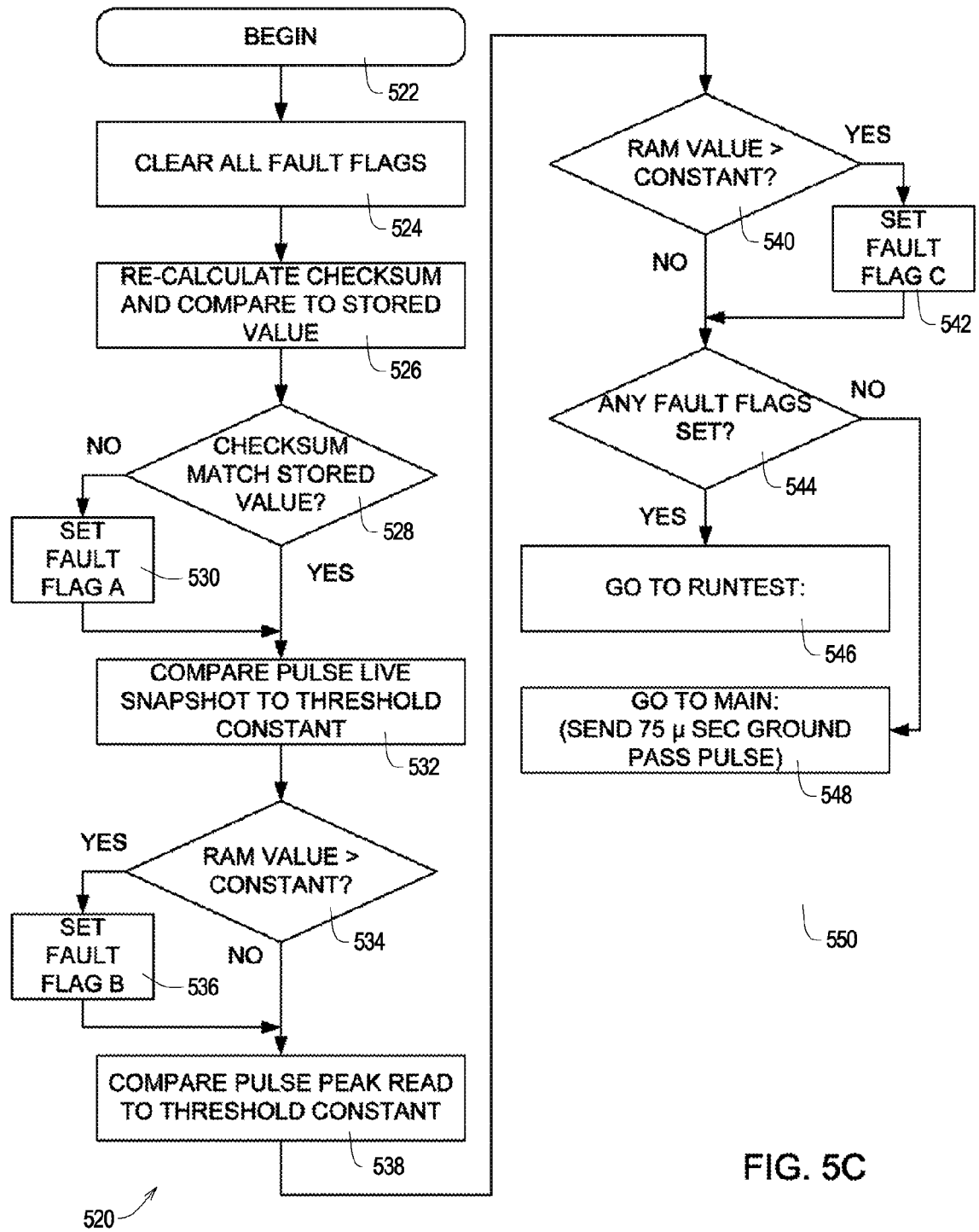
Figure 5D:
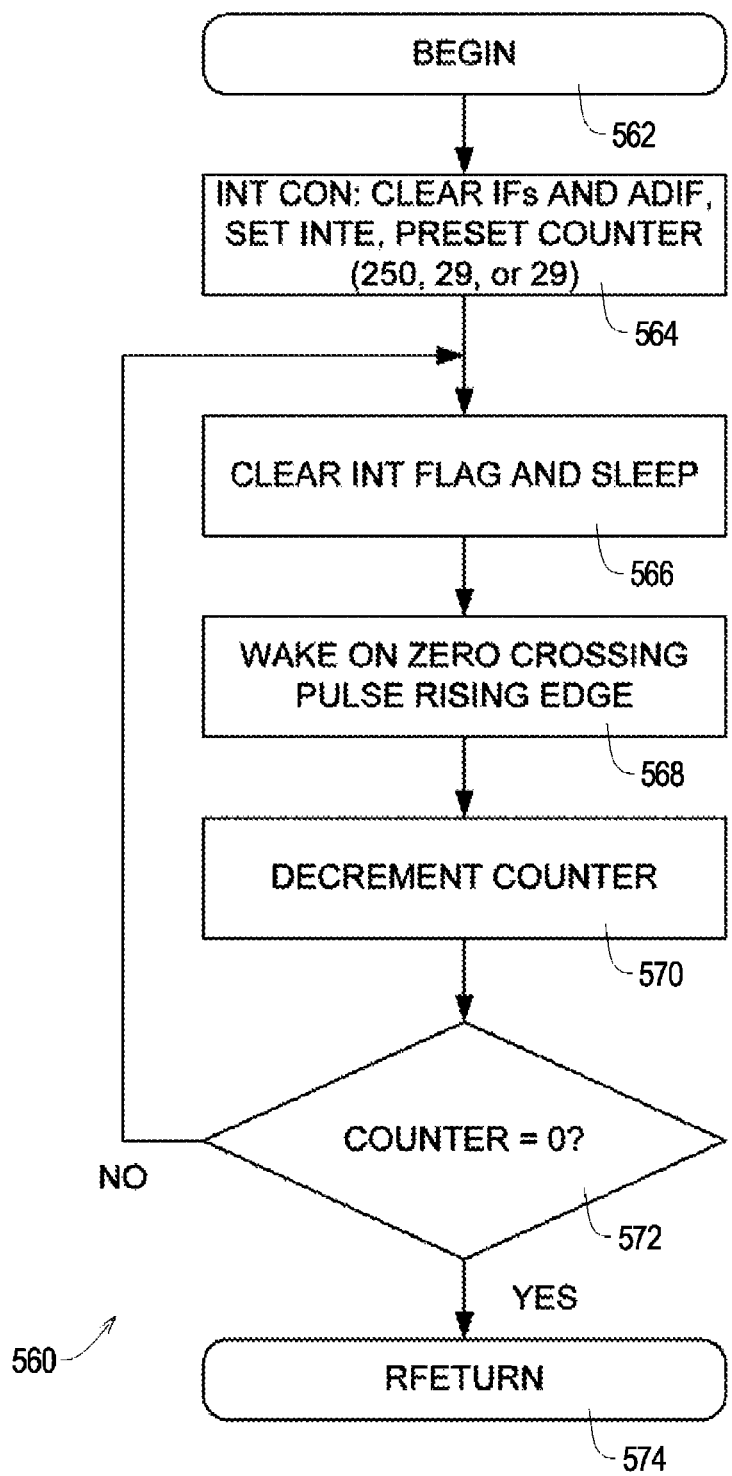

FIG. 5C depicts an example pass/fail routine 520 that may be performed at step 436 in the main routine 420. The example pass/fail routine 520 begins at step 522 and clears all fault flags at step 524. A checksum value is calculated at step 526. If the calculated checksum value does not match a stored reference checksum value at step 528, a fault flag A is set at set 530 and the pass/fail routine moves on to a step 532. If the calculated checksum value matches the stored reference checksum value at step 528, the pass/fail routine moves on to step 532 without setting the fault flag A.

At step 532, the pass/fail routine 520 compares a pulse live snapshot value (e.g, represented by the PULSE data value described above) with a pulse shape threshold value corresponding to shape of the VOLTAGE pulse signal indicative of an acceptable ground connection. At step 534, if a RAM value corresponding to the result of the comparison performed in step 532 exceeds a predetermined pulse shape threshold value, the pass/fail routine sets a fault flag B at step 536 and proceeds to step 538. If the RAM value corresponding to the result of the comparison is less than or equal to the predetermined pulse shape threshold value, the pass/fail routine 520 proceeds to step 538 without setting fault flag B.

At step 538, the pass/fail routine 520 compares a pulse peak value (e.g, represented by the 1.2V Vref vs. PULSE_PEAK data value described above) with a pulse peak threshold value corresponding to peak of the VOLTAGE pulse signal indicative of an acceptable ground connection. At step 540, if a RAM value corresponding to the result of the comparison performed in step 538 exceeds a predetermined pulse peak threshold value, the pass/fail routine sets a fault flag C at step 542 and proceeds to step 544. If the RAM value corresponding to the result of the comparison is less than or equal to the predetermined pulse peak threshold value, the pass/fail routine 520 proceeds to step 544 without setting fault flag C.

At step 544, the pass/fail routine 520 determines whether any of the fault flags A, B, or C have been set. If any of the fault flags A, B, or C have been set, the pass/fail routine 520 goes to step 546 at which the pass/fail routine 520 returns to step 430 of the main routine 420 and performs the run test routine. If none of the fault flags A, B, or C have been set, the pass/fail routine 520 goes to step 546 at which the pass/fail routine 520 returns to step 438 of the main routine 420 and generates the ground pass pulse.

An example of a delay routine 560 that may be used to perform one or all of the first, second, or third delays identified at steps 426, 428, or 432 of the main routine 420. The delay routine 560 begins at step 562 and then proceeds to step 564 at which the interrupt flags for the counter internal to the microprocessor 330 are cleared and the counter is preset to a value corresponding to the desired delay time. In particular, the input to wake the microprocessor is the ZERO CROSS signal generated by the zero cross circuit 350 described above. In particular, the example internal microprocessor counter is decremented each time it wakes up in response to the ZERO CROSS signal (e.g., once per complete cycle of the AC line voltage).

In each count cycle, the microprocessor puts itself to sleep at step 566 and waits for the next zero cross rising edge. The microprocessor 330 then wakes up at each ZERO CROSS pulse at step 568 and decrements the counter at step 570. At step 572, the delay routine 560 determines whether the counter has reached zero. If not, the delay routine 560 returns to step 566 and repeats steps 568 and 570. When the counter reaches zero, the delay routine 560 proceeds to step 574 and returns to the main routine.

In the example main routine 420, the first, second, and third delay steps correspond to first, second, and third delay periods A, B, and C. The example delay routine 560 can be used to implement any one of the first delay period A, the second delay period B, and/or the third delay period C. In the example ground quality check circuit 320, the first delay period A corresponds to 250 cycles of the AC line voltage and thus corresponds to slightly more than 4 seconds of delay at 60 Hz. The second delay period B corresponds to 29 cycles of the AC line voltage and will result in a delay of slightly less than 0.5 seconds at 60 Hz. The third delay period C also corresponds to 29 cycles of the AC line voltage and will result in a delay of slightly less than 0.5 seconds at 60 Hz.

With the arrangement of the first delay period A, second delay period B, and third delay period C in the main routine 420, the system is initially allowed to stabilize for a few seconds (e.g., fully charge capacitors C6 and C9) before any testing is performed. Subsequently, the ground connection is tested approximately every second so long as the ground pulse transmission characteristics are determined to be within the acceptable parameters defined by test criteria. If the ground pulse transmission characteristics ever fall outside of the parameters defined by test criteria, the ground connection is tested approximately every one-half second for as long as the ground connection continues to fall outside of the parameters defined by test criteria.

Figure 6:
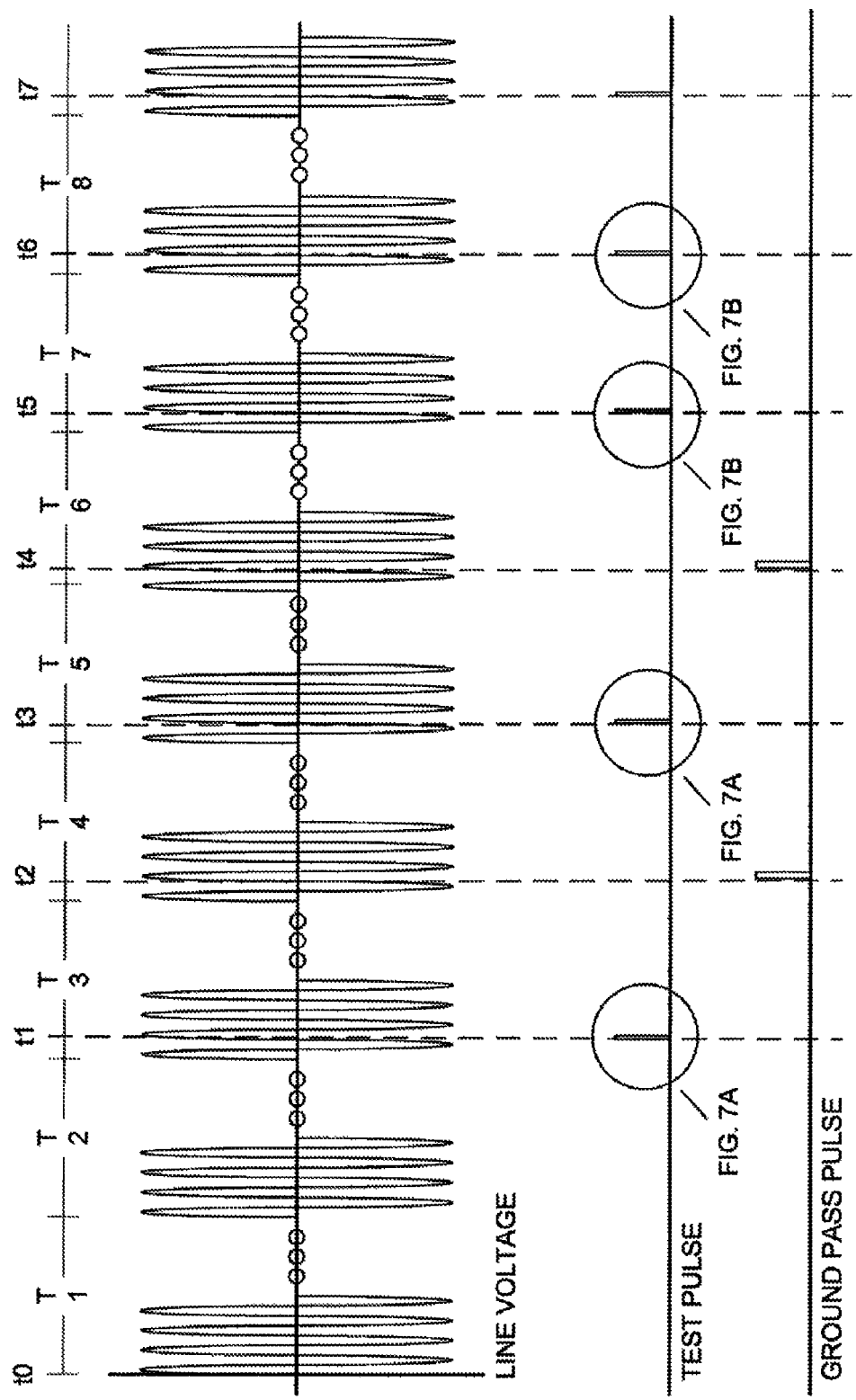
FIG. 6 is a timing diagram showing an example of the operation of a ground quality check system of the present invention.

FIG. 6 illustrates an example of operation of the example ground quality check circuit 320. The appliance is plugged in at t0, and the time period T1 corresponds to the first delay period A. The time period T2 then corresponds to the delay period B, after which a TEST pulse is generated at a time t1 upon the receipt of the next ZERO CROSS signal. Then, assuming that the MEASURED pulse meets the predetermined test criteria, the GROUND PASS pulse is generated at a time t2 after a time period T3 corresponding to the third delay period C. As long as the VOLTAGE pulse continues to meet the predetermined test criteria, the GROUND PASS pulse is periodically generated (e.g., at a time t3 after a time periods T4 and T5, or approximately every 1 second).

Figure 7A:
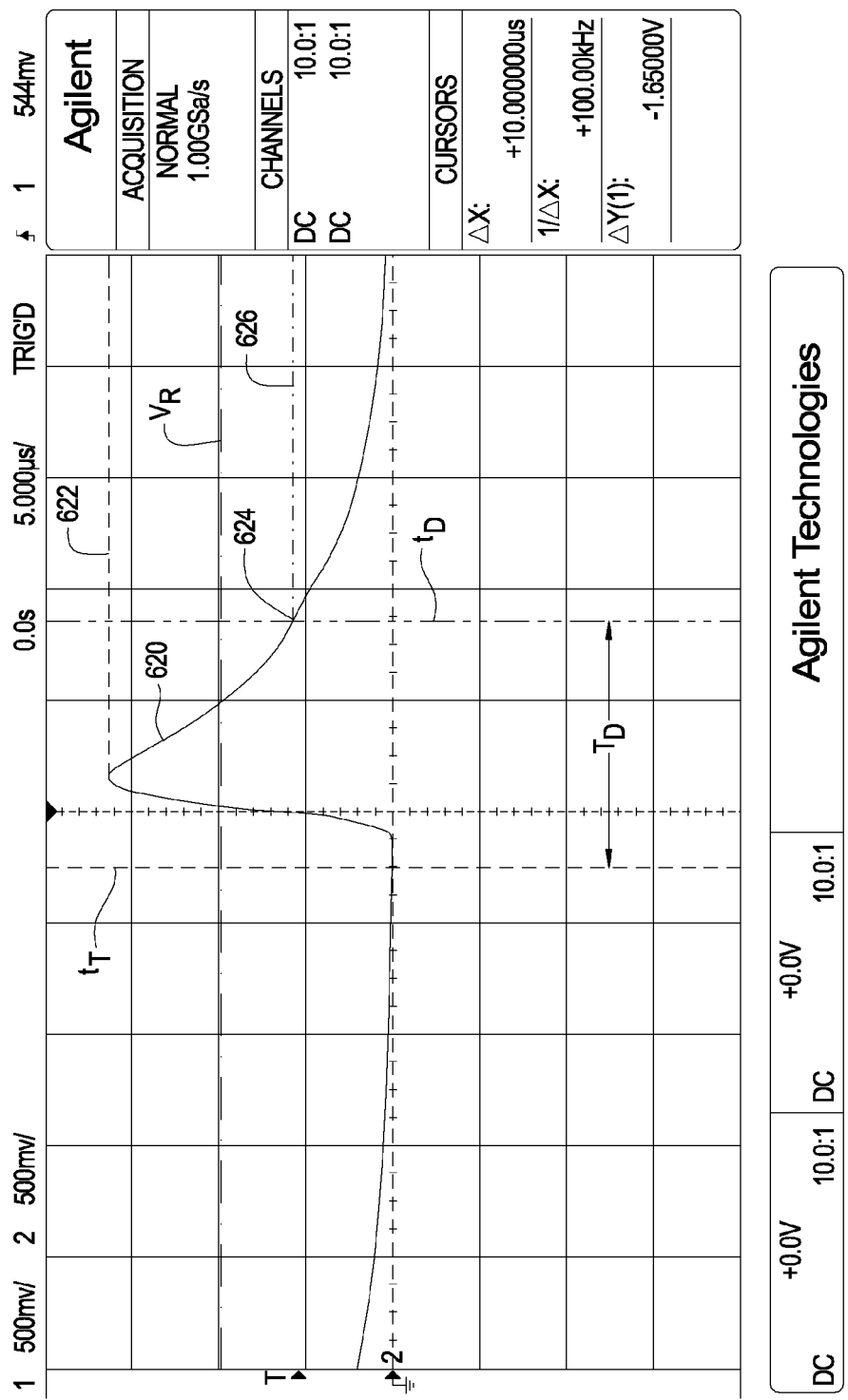

FIG. 7A illustrates an example of a pulse signal 620 that meets both of the example test criteria implemented by the example ground quality check circuit 320. In particular, a large dash line in FIG. 7A illustrate a trigger point $t_P$, a large dash single dot line indicates a peak reference voltage level $V_R$, and a large dash double dot line indicates a delay measurement point $t_D$. A time period $T_D$ indicates a delay between the trigger point $t_P$ and the Delay Measurement point $t_D$. FIG. 7A illustrates that the pulse signal 620 defines a pulse peak voltage level 622 and intersects the delay measurement point $t_D$ at a decay voltage level 626. The pulse peak voltage level 622 meets two criteria indicative of an appropriate ground connection: (1) the pulse peak voltage level 622 is above the peak reference voltage level $V_R$; and (2) the decay voltage level 626 does not exceeds a certain percentage of the pulse peak voltage level 622 at the delay measurement point $t_P$.

At a time t5, the VOLTAGE pulse no longer meets at least one of the test criteria as indicated by 622 FIG. 7B. The example VOLTAGE pulse depicted in FIG. 7B does not meet the example pulse peak test criteria (e.g., peak too low) or the example pulse shape criteria (e.g., pulse decays too slowly). In particular, FIG. 7B illustrates that the pulse signal 630 defines a pulse peak voltage level 632 and intersects the delay measurement point $t_D$ at a decay voltage level 636. The pulse peak voltage level 632 does not meet either of the two criteria indicative of an appropriate ground connection: (1) the pulse peak voltage level 632 is below the peak reference voltage level $V_R$; and (2) the decay voltage level 636 exceeds a certain percentage of the pulse peak voltage level 632 at the delay measurement point $t_p$.

The GROUND PASS pulse is thus not generated at time t6. Further, the main routine 420 reruns the test routine and pass/fail routine in a loop including only the third delay period C. Accordingly, the main routine 420 continues to test the ground connection approximately every one-half second for as long as the MEASURED pulse does not meet one or both of the example test criteria. Further, as long as the MEASURED pulse does not meet one or both of the example test criteria, the GROUND PASS pulse signal is low (i.e., no GROUND PASS pulses generated) at times t6 and 67.

Any test criteria suitable for evaluating whether the ground connection is acceptable can be used based on the particulars of the TEST pulse and circuitry for sampling and measuring the VOLTAGE pulse. The example pulse peak criteria determine whether the peak of the VOLTAGE pulse determines whether the peak of the VOLTAGE pulse exceeds a predetermined value (e.g., the peak reference voltage level $V_R$). The exact value of the voltage level $V_R$ depends on the choice of values elsewhere in the ground fault qualifier circuit 320. For example, the peak reference voltage level $V_R$ can be determined based on the choice of values of the resister divider formed by R13 and R14 and the value of the regulated voltage Vcc as appropriate to meet accuracy, dynamic range, and current consumption goals.

The example pulse shape criteria determine whether the shape of the measured pulse is such that the measured pulse does not decay to a certain percentage of the peak value within a predetermined period of time (e.g., $T_D$). The example pulse shape criteria of the example depicted in FIGS. 7A and 7B determine that the pulse fails when the pulse voltage fails to fall below a first level of approximately 47% of the pulse peak voltage level. This represents a conservative midpoint between a worst case circuit impedance with a good ground and the much slower decay of 15% to 30% from peak at the same time for a person or water completing the ground circuit. In any event, the pulse should be found to fail when the pulse voltage fails to fall within a first range of approximately 45-50% of the pulse peak voltage level and should in any event bee within a first range of approximately 40-60% of the pulse peak voltage level.

In the example ground fault qualifier circuit 320, the leading edge of the trigger pulse that fires the Triac of that circuit 320 defines the trigger point $t_P$. When the Triac transitions into conduction, it bypasses the diode D6 and resistor R12, dumping the accumulated charge on C6 into the circuit formed by C7, and the delay period $T_D$ (~11 μs) is determined by the delays introduced by the capacitor C7, the line conductor 40, the mains transformer (not shown), the ground/neutral connection at the mains transformer (not shown), the ground wire 44 and associated plug (not shown) and chassis ground (not shown), and resistors R14 and R13. The current pulse from the charge dump from capacitor C6 creates a voltage pulse across resistor R14. The peak value of this voltage pulse across resistor R14 is buffered, held, and applied to the reference input of the A/D converter. Accordingly, approximately 11 μSec after the trigger pulse, the A/D conversion begins. This delay is determined based on the system components to obtain a numerical measurement the pulse peak voltage level and the decay voltage level.

Other methods of generating the test pulse and comparing the test pulse with criteria such as the minimum peak voltage level and minimum decay after the trigger point can be used instead of the circuit 320 described herein. However, the circuit 320 is optimized to detect an improper ground connection while using minimum power and generating few false failure signals.

The principles of the present invention may be embodied in forms other than those described herein. The scope of the present invention should thus be determined by the claims appended hereto or presented in the future and not the examples embodied by the circuits and routines described herein.

What is claimed is:

1. A ground check system for checking a ground conductor of a power supply comprising at least one line conductor, the ground check system comprising:
   a pulse generator for applying a test signal to a test circuit formed at least in part by the ground conductor and the at least one line conductor when an AC voltage on the at least one line conductor is approximately zero volts; and
   a compare circuit for comparing the test signal passing through the test circuit with at least one test criteria indicative of an unacceptable ground.

2. A ground check system as recited in claim 1, in which the test criteria is indicative of at least one of a missing ground and a faulty ground.

3. A ground check system as recited in claim 1, in which the test criteria determines whether a peak of the test signal falls within predetermined peak reference criteria.

4. A ground check system as recited in claim 1, in which the test criteria determines whether a shape of the test signal falls within predetermined shape reference criteria.

5. A ground check system as recited in claim 1, in which the test criteria determines whether a peak of the test signal falls within predetermined peak reference criteria and whether a shape of the test signal falls within predetermined shape reference criteria.

6. A ground check system as recited in claim 1, further comprising a zero cross detector for generating a zero cross signal indicative of when an AC voltage on the at least one line conductor is at zero volts.

7. A ground check system as recited in claim 1, further comprising a pulse peak detect system for generating a pulse peak data value indicative of the peak voltage of the test signal, where the compare circuit compares the pulse peak data value with a reference peak data value.

8. A ground check system as recited in claim 1, further comprising a pulse shape detect system for generating a pulse data value indicative of the voltage of the test signal after a predetermined period of time, where the compare circuit compares the pulse shape data value with a reference shape data value.

9. A ground check system as recited in claim 1, further comprising:
   a pulse peak detect system for generating a pulse peak data value indicative of the peak voltage of the test signal;
   a pulse shape detect system for generating a pulse data value indicative of the voltage of the test signal after a predetermined period of time; wherein
   the compare circuit compares
      the pulse peak data value with a reference peak data value; and
      the pulse shape data value with a reference shape data value.

10. A method of checking a ground conductor of a power supply comprising at least one line conductor, the method comprising the steps of:
   forming a test circuit including at least the ground conductor and the at least one line conductor;
   applying a test signal to a test circuit when an AC voltage on the at least one line conductor is approximately zero volts; and
   comparing the test signal passing through the test circuit with at least one test criteria indicative of an unacceptable ground.

11. A method recited in claim 10, in which the test criteria is indicative of at least one of a missing ground and a faulty ground.

12. A method as recited in claim 10, in which the test criteria determines whether a peak of the test signal falls within predetermined peak reference criteria.

13. A method as recited in claim 10, in which the test criteria determines whether a shape of the test signal falls within predetermined shape reference criteria.

14. A method as recited in claim 10, in which the test criteria determines whether a peak of the test signal falls within predetermined peak reference criteria and whether a shape of the test signal falls within predetermined shape reference criteria.

15. A method as recited in claim 10, further comprising the step of detecting when an AC voltage on the at least one line conductor is at zero volts.

16. A method as recited in claim 10, further comprising the step of generating a pulse peak data value indicative of the peak voltage of the test signal, where the step of comparing the test signal passing through the test circuit with at least one test criteria comprises the step of comparing the pulse peak data value with a reference peak data value.

17. A method as recited in claim 10, further comprising the step of generating a pulse data value indicative of the voltage of the test signal after a predetermined period of time, where the step of comparing the test signal passing through the test circuit with at least one test criteria comprises the step of comparing the pulse shape data value with a reference shape data value.

18. A method as recited in claim 10, further comprising the steps of:
   generating a pulse peak data value indicative of the peak voltage of the test signal;
   generating a pulse data value indicative of the voltage of the test signal after a predetermined period of time;
   wherein the step of comparing the test signal passing through the test circuit with at least one test criteria comprises the steps of
      comparing the pulse peak data value with a reference peak data value
      comparing the pulse shape data value with a reference shape data value.

19. A ground check system for checking a ground conductor of a power supply comprising at least one line conductor, the ground check system comprising:
   a zero cross detector for generating a zero cross signal indicative of when an AC voltage on the at least one line conductor is at zero volts;

a pulse generator for applying a test signal to a test circuit formed at least in part by the ground conductor and the at least one line conductor based on the zero cross signal;

a pulse peak detect system for generating a pulse peak data value indicative of the peak voltage of the test signal;

a pulse shape detect system for generating a pulse data value indicative of the voltage of the test signal after a predetermined period of time; and a processor for generating a ground pass signal when the pulse peak data value meets predetermined peak criteria and the pulse shape data value meets predetermined shape criterial.

20. A ground check system as recited in claim 19, in which;

the pulse shape detect system generating the pulse data value such that the pulse data value is indicative of the voltage of the test signal a predetermined period of time after a leading edge of the test signal; and the processor generates the ground pass signal when
the pulse peak data value exceeds a reference peak data value;
the pulse shape data value exceeds a reference shape data value.

* * * * *